United States Patent
Brown et al.

(10) Patent No.: US 7,504,349 B2
(45) Date of Patent: Mar. 17, 2009

(54) LEAD-FREE AND CADMIUM-FREE CONDUCTIVE COPPER THICK FILM PASTES

(75) Inventors: Orville W. Brown, Lansdale, PA (US); Srinivasan Sridharan, Strongsville, OH (US)

(73) Assignee: Ferro Corporation, Cleveland, OH (US)

( * ) Notice: Subject to any disclaimer, the term of this patent is extended or adjusted under 35 U.S.C. 154(b) by 0 days.

(21) Appl. No.: 11/609,998

(22) Filed: Dec. 13, 2006

(65) Prior Publication Data

US 2007/0108423 A1    May 17, 2007

Related U.S. Application Data

(62) Division of application No. 10/864,304, filed on Jun. 9, 2004, now Pat. No. 7,176,152.

(51) Int. Cl.
*C03C 8/18* (2006.01)
*C03C 8/22* (2006.01)
*H01B 1/02* (2006.01)

(52) U.S. Cl. .................. 501/19; 501/16; 252/512; 252/521.3; 252/521.4; 252/519.54; 427/126.1; 427/126.2; 427/383.1

(58) Field of Classification Search .......... 501/16, 501/19; 252/512, 521.3, 521.4, 519.54; 427/126.1, 427/126.2, 383.1
See application file for complete search history.

(56) References Cited

U.S. PATENT DOCUMENTS

| | | |
|---|---|---|
| 3,615,772 A | 10/1971 | Kohut |
| 4,152,282 A | 5/1979 | Baudry et al. |
| 4,220,547 A | 9/1980 | Abe et al. |
| 4,323,652 A | 4/1982 | Baudry et al. |
| 4,379,319 A | 4/1983 | Wilson |
| 4,517,155 A | 5/1985 | Prakash et al. |
| 4,880,567 A | 11/1989 | Prabhu et al. |
| 4,906,406 A | 3/1990 | Hormadaly |
| 5,051,381 A | 9/1991 | Ohji et al. |
| 5,165,986 A | 11/1992 | Gardner et al. |
| 5,296,426 A | 3/1994 | Burn |
| 5,439,852 A | 8/1995 | Hormadaly |
| 5,468,695 A | 11/1995 | Carroll et al. |
| 5,491,118 A | 2/1996 | Hormadaly |
| 5,753,571 A | 5/1998 | Donohue |
| 5,948,536 A | 9/1999 | Suzuki et al. |
| 6,105,394 A | 8/2000 | Sridharan et al. |
| 6,124,224 A | 9/2000 | Sridharan et al. |
| 6,171,987 B1 | 1/2001 | Hormadaly |
| 6,185,087 B1 | 2/2001 | Park et al. |
| 6,673,274 B2 | 1/2004 | Venigalla et al. |
| 6,982,864 B1 | 1/2006 | Sridharan et al. |
| 7,176,152 B2 | 2/2007 | Brown et al. |
| 2006/0028788 A1 | 2/2006 | Sridharan et al. |

FOREIGN PATENT DOCUMENTS

JP    2000-106033    *   4/2000
JP    2000-138010    *   5/2000

* cited by examiner

*Primary Examiner*—Karl E Group
(74) *Attorney, Agent, or Firm*—Rankin, Hill & Clark LLP

(57) ABSTRACT

Thick film conductive copper pastes that are lead-free and cadmium-free. The inventive copper pastes possess desirable characteristics, including good solderability, good wire bondability, a low firing temperature, and a wide temperature processing window, and provide excellent adhesion to a variety of substrates, including alumina and glass coated stainless steel substrates, as well as low resistivity, and a microstructure after firing that is dense and substantially free of pores.

15 Claims, No Drawings

LEAD-FREE AND CADMIUM-FREE CONDUCTIVE COPPER THICK FILM PASTES

CROSS-REFERENCE TO RELATED APPLICATIONS

This application is a divisional of U.S. application Ser. No. 10/864,304, filed Jun. 9, 2004, now U.S. Pat. No. 7,176,152, issued Feb. 13, 2007, which is hereby incorporated by reference in its entirety.

FIELD OF THE INVENTION

This invention relates to lead- and cadmium- free conductive copper thick film pastes for use in producing circuits and electronic devices.

BACKGROUND

The thick film circuit is one well-known form of monolithic integrated microelectronic circuit. Circuits of this type are particularly useful where a large number of passive components are required, or where moderately high power dissipation is required. Thick film circuits are less costly to produce and can yield a broader range of resistance values than thin film circuits.

The manufacture of thick film circuits is a refinement of the well-known art of silk-screen printing. Thick film circuits consist of patterns of conductors, resistors and other passive circuit components printed on a particular substrate. In most known processes, a variety of pastes are applied onto a substrate or successive circuit layers through a screen or a template of a specific printed pattern. The successive layers are dried after printing and fired in a belt furnace to sinter the material.

In a typical thick film circuit, the substrate is often a ceramic material, such as alumina. However, for demanding applications such as in automotive electronics where protection against breakage due to vibrations is required, glass coated metallic such as stainless steel substrates are used. In these applications there is much room for improvement. Thick film pastes are typically compositions of glass particles, metal and/or metal oxide particles, together with organic solvents, resins and viscosity control agents known as thixotropes. The compositions of these thick film pastes depend upon the type of passive electrical component being printed.

A variety of metal-containing thick film compositions (i.e., pastes, inks, tapes, etc.) useful in forming resistors, dielectrics and conductors which are employed in hybrid microelectronic components have been developed in the field of hybrid microelectronics. Generally, such compositions, and particularly paste or ink compositions, include a conductor (e.g., silver, palladium, copper, aluminum, gold, platinum, and the like as well as alloys of each of these different metals), resistive or dielectric components, a binder or an inorganic fluxing material, (e.g., a glass or inorganic oxides), and a carrier or vehicle comprising generally a solvent with a resin and a thixotrope and/or a wetting agent.

The above-described paste or ink compositions are applied in the desired configuration or pattern onto a suitable substrate to form the desired circuit for use as a hybrid microelectronic component. There have been a number of substrate materials developed for use in these applications. For example, such traditional substrate materials may include alumina ($Al_2O_3$), glass coated metal, barium titanate ($BaTiO_3$), beryllia (BeO), aluminum nitride (AlN), and silicon carbide (SiC).

The prior art sought to achieve desirable thick film properties in various ways. The introduction of cadmium and lead to the prior art glass compositions provided important characteristics such as moderate linear coefficient of expansion, improved solder leach resistance, and good chemical durability compared to glasses containing high concentrations of alkali oxides, and the ability to fire these thick film paste compositions at fairly low temperatures. The inorganic fluxing materials especially the glass compositions in the thick film pastes impart many characteristics such as adhesion to substrates, solder leach resistance for the thick film compositions. A glass composition comprising PbO is illustrated, for example, in the patent to Hormadaly, U.S. Pat. No. 5,114,885. It is known that the use of PbO as an ingredient in a glass component of a conductive film tends to lower the firing temperature of these thick film compositions and produce a coating that has a superior surface finish. For this and other reasons, PbO and CdO were significant components in many prior art thick film glass compositions. However, in light of environmental concerns, the use of PbO as well as of CdO, in thick film or glass enamel compositions is now largely avoided whenever possible. Hence, a need exists in the electronics industry for thick film compositions, which afford desirable properties using lead free and cadmium free glasses in thick film pastes.

SUMMARY OF THE INVENTION

In general, the present invention provides a lead- and cadmium-free conductive thick film paste having a metal component and a glass component. The metal component comprises copper. The glass component comprises a first glass and a second glass. The first glass composition comprises about 25 to about 67 mole % BaO, about 33 to about 70 mole % $SiO_2+B_2O_3$, about 0.1 to about 20 mole % $TiO_2$. The second glass composition comprises about 27 to about 65 mole % ZnO, and about 33 to about 70 mole % $SiO_2+B_2O_3$. The first and second glasses may be present in the glass component in a weight ratio of about 1:40 to about 20:1. When in a green, unfired state, the inventive paste composition has a viscosity of from about 200 to about 500 kilocentipoise (kcps) at 10 rpm when measured at 25° C. using Brookfield HBT type SC4 14/5R viscometer and spindle 14 assembly. The lead- and cadmium-free thick film pastes of the present invention possess desirable properties, including proper rheology, good shelf life, moderate linear coefficient of expansion, good adhesion to the substrates, good chemical resistance and mechanical durability, excellent solder leach resistance, excellent solder wetting, and low resistivity, all achieved by a lead free and cadmium free paste that can be fired at relatively low temperatures with a wide processing window.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

DETAILED DESCRIPTION OF THE INVENTION

The present invention provides a lead-free and cadmium-free conductive thick film paste, which contains copper, for use in producing hybrid microelectronic components. This thick film paste includes a glass component that flows at relatively low firing temperatures.

The automotive industry requires thick film electronic systems with thicker and wider tracks for increased low power handling characteristics with low voltage drop in the tracks to minimize undesired power dissipation. Such thick film systems are fabricated on glass-coated rigid metallic substrates such as stainless steel for protection against breakage from vibration as well as on alumina substrates for low loss radio frequency (RF) applications in the 1-3 GHz range.

In order to minimize interaction with resistors prefired at 900° C. or greater, thus minimizing shifts in the thermal coefficient of resistance (TCR) and resistivity, it is preferable to fire these new conductors at a lower temperature, for example about 750° C., about 700° C., or most preferably about 650° C. Other applications will require firing at about 800° C. or about 850° C. Hence, the inventive thick films with a wide processing window (650-850° C.) have an advantage over the prior art. The inventive thick films possess additional desirable characteristics such as good solderability (i.e., excellent solder wetting), good wire bondability, low resistivity, and provide excellent adhesion to a variety of substrates, including 96% alumina and glass coated stainless steel substrates, as well as low resistivity, and a microstructure after firing that is dense and substantially free of pores.

Copper is an ideal conductor material for thick film and power electronic applications because it has a high electrical conductivity, high thermal conductivity, resists solder leaching, and resists electro migration much better than other conductors such as silver, and can handle a high current density. Prior art low-temperature firing copper thick film systems exhibit minimal adhesion to common substrates, poor solderability and often contain undesirable metals such as lead or cadmium.

As has been stated, the inventive paste compositions are conductive. While the line between conductors and resistors is often unclear, the paste compositions of the present invention have a maximum resistivity of about 20 milliOhms per square (mOhm/square).

The present invention also provides an electronic device having a lead-free and cadmium-free glass composition applied thereto and fired to form an electrical circuit. Electronic devices upon which the lead-free and cadmium-free glass composition can be applied and fired include thick film and/or hybrid thick film devices such as, for example, surge resistors (thick film resistors printed on alumina substrates that are used to protect telephone lines from lightning or other electrical over voltage conditions), high-current, high-power automotive electronics (e.g., air bag deployment sensors, weight-sensors, anti-lock braking systems, and a variety of other automotive sensors), defrosters and thick film circuitry on automotive windshields and solar cells in solar panels such as the conductive leads on such devices. Throughout the instant specification and in the appended claims, the term "electronic device" means any electronic device that includes thick film and/or hybrid thick film circuitry that would survive at least the firing temperatures disclosed herein and benefit from the protection provided by the lead-free and cadmium-free thick film paste composition.

In general, the present invention provides a lead- and cadmium-free thick film paste having a metal component and a glass component. The metal component comprises copper. The glass component comprises a first glass and a second glass, and is free of lead, cadmium and compounds of lead and cadmium.

The lead-free and cadmium-free paste of the present invention is generally applied to a surface of an electronic device upon which has been formed one or more circuits or other electronic components (e.g., capacitors and resistors). The thick film paste is preferably dried and fired, as is more thoroughly described below, to form a lead and cadmium free electrical circuit. As used throughout the instant specification in the appended claims, the phrase "lead-free and cadmium-free" means that no lead, or PbO, cadmium, or CdO, has been intentionally added to the composition, and that the composition comprises less than about 0.1% by weight Pb or Cd after firing.

In particular, the inventive paste may be applied to a substrate by means of screen printing. The paste may contain an organic carrier or vehicle, providing appropriate viscosity in order to pass through the screen. The paste may also contain a thixotropic material in order to set up rapidly after being screened to give good resolution. While the Theological properties are of primary importance, the carrier is preferably formulated also to give appropriate wettability of the solids and the substrate, good drying rate, dried film strength sufficient to withstand rough handling, and good firing properties. Satisfactory appearance of the fired composition is also important.

In view of all of the foregoing criteria, a wide variety of inert liquids may be used in the carrier. The carrier for most conductive compositions is typically a solution of a resin dissolved in a solvent and, frequently, a solvent solution containing both resin and a thixotropic agent. The solvent usually boils within the range of about 130° C. to about 350° C. The most frequently used resin for this purpose is ethyl cellulose. However, resins such as ethyl hydroxy ethyl cellulose, wood rosin, mixtures of ethyl cellulose and phenolic resins, polymethacrylates of lower alcohols and monobutyl ether of ethylene glycol monoacetate can also be used. The most widely used solvents for thick film applications are terpenes such as alpha- or beta-terpineol or mixtures thereof with other solvents such as kerosene, dibutyl phthalate, butyl carbitol, butyl carbitol acetate, hexylene glycol, texanol, and high-boiling alcohols and alcohol esters. Various combinations of these and other solvents formulated to obtain the desired viscosity and volatility requirements for each application.

Among commonly used thixotropic agents are organic based thixotropes such as, for example, hydrogenated castor oil and derivatives thereof. It is of course, not always necessary to incorporate a thixotropic agent because the solvent/resin properties coupled with the sheer thinning inherent in any suspension may alone be suitable in this regard. Furthermore, a wetting agent may be employed such as fatty acid esters, e.g., N-tallow-1,3-diaminopropane di-oleate, N-tallow trimethylene diamine diacetate, N-coco trimethylene diamine, beta diamines, N-oleyl trimethylene diamine, N-tallow trimethylene diamine, and/or N-tallow trimethylene diamine dioleate.

The ratio of carrier to solids in the inventive conductive compositions may vary considerably and is dependent upon the manner in which the conductive compositions are to be applied and the type of carrier used. Normally to achieve good coverage, the conductive composition may contain by weight 60-90% solids and 40-10% of a liquid carrier. Such conductive compositions are usually of semi-fluid consistency and are referred to commonly as "pastes."

For the purposes of the present invention, the copper paste preferably contains from about 70% to about 90% by weight solids and from about 10 to about 30% by weight of the liquid carrier. Furthermore, the preferred ranges of components in the solids portion for the paste composition according to the present invention is as follows: a) a metal component comprising copper or an alloy of copper, from about 65 to about 99 percent, preferably from about 80 to about 98 by weight of the solids; b) a glass component from about 1 to about 35 percent, preferably from about 2 to about 20 percent by weight of the solids. With respect to the carrier, it is found that the preferred composition according to the present invention is as follows: 1) at least about 90 percent by weight organic solvent; 2) up to about 15 percent by weight resin; 3) up to about 4 percent by weight thixotropic agent; and 4) up to about 2 percent by weight wetting agent. Exemplary vehicles are 2752 and 308-5V both available from Ferro Corporation which consist of ethyl cellulose and elvacite dissolved in terpineol. The copper metal is advantageously provided in the form of powders and/or flakes. Copper powders suitable for use in the present invention include copper products sold under the name Cu-015, Cu-030, Cu-10K, all available from Ferro Corporation, Cleveland, Ohio.

The glass component comprises one or more glasses, usually provided initially in the form of one or more glass powders. In one embodiment, the invention provides a thick film conductive paste, said paste including a Pb- and Cd-free glass component, said glass component comprising: a first glass composition, comprising in mole %: about 25 to about 67% BaO, about 33 to about 70% $SiO_2+B_2O_3$, about 0.1 to about 20% $TiO_2$, and a second glass composition comprising in mole %: about 27 to about 65% ZnO, about 33 to about 70% $SiO_2+B_2O_3$, wherein the first and second glasses are present in a weight ratio of 1:40 to about 20:1. The first glass may further comprise SrO, wherein the total BaO+SrO present in the first glass composition is about 10 to about 70 mole %. The first glass composition may further comprise CaO, wherein the total BaO+CaO present in the first glass is about 10 to about 70 mole %.

In a variation of this embodiment, the second glass composition further comprises about 0.1 to about 10 mole % $TiO_2+ZrO_2$. In this embodiment, the second glass composition further comprises about 0.1 to about 15 mole % $Li_2O+Na_2O+K_2O$. The second glass may further comprise about 0.1 to about 10 mole % $Al_2O_3$. The second glass may also comprise about 0.1 to about 20 mole % $Nb_2O_5$. The second glass may yet further comprise about 0.1 to about 15 mole % $Li_2O+Na_2O+K_2O$. Further, the second glass may further comprise CuO, wherein the total ZnO+CuO in the second glass is about 0.1 to about 65 mole %.

The inventive glass component may further comprise a third glass composition, wherein the third glass composition comprises about 5 to about 80 mole % $Bi_2O_3$. The third glass may optionally comprise about 10 to about 65 mole % $Bi_2O_3$ or more preferably about 15 to about 50 mole % $Bi_2O_3$. The third glass component may further comprise about 0.1 to about 25 mole % CuO, and still further may comprise about 0.1 to about 10 mole % NiO.

In yet another embodiment, the invention provides a thick film paste, said paste including a Pb- and Cd-free glass component, said glass component comprising a first glass that comprises about 35 to about 65 mole % BaO, about 35 to about 66 mole % $SiO_2+B_2O_3$, and about 0.1 to about 10 mole % $TiO_2$, and a second glass that comprises about 30 to about 60 mole % ZnO, about 40 to about 60 mole % $SiO_2+B_2O_3$, and about 0.1 to about 10 mole % $ZrO_2$ wherein the first and second glasses are present in the ratio from about 1:40 to about 20:1. The first glass may further comprise SrO, wherein the total of BaO+SrO is about 25 to about 75 mole %. The first glass may further comprise about 15 to about 30 mole % ZnO.

In another embodiment, the glass component may further comprise a third glass composition wherein the third glass comprises about 15 to about 65 mole % $Bi_2O_3$, or about 20 to about 50 mole % $Bi_2O_3$. The glass component comprises about 2.5 to about 80 wt % of the first glass and about 2 to about 97.5 wt % of the second glass. When the third glass is present, the glass component comprises from about 2 to about 80 wt % of the third glass composition.

In still another embodiment the invention provides a thick film paste, said paste including a Pb- and Cd-free glass component, said glass component comprising a first glass, comprising about 5 to about 35 mole % ZnO, about 5 to about 40 mole % $SiO_2$, about 2 to about 35 mole % $B_2O_3$, and a second glass comprising about 20 to about 70 mole % $Bi_2O_3$, about 20 to about 55 mole % $SiO_2$, about 2 to about 30 mole % $B_2O_3$; wherein the first and second glasses are present in a weight ratio of about 1:40 to about 20:1. In another embodiment, the first glass comprises about 10 to about 30 mole % ZnO.

It should be kept in mind that the foregoing compositional ranges are preferred and it is not the intention to be limited to these ranges where one of ordinary skill in the art would recognize that these ranges may vary depending upon specific applications, specific components and conditions for processing and forming the end products.

The paste according to the present invention may be conveniently prepared on a three-roll mill. The amount and type of carrier utilized are determined mainly by the final desired formulation viscosity, fineness of grind of the paste, and wet print thickness. In preparing compositions according to the present invention, the particulate inorganic solids are mixed with the carrier and dispersed with suitable equipment, such as a three-roll mill, to form a suspension, resulting in a composition for which the viscosity will be in the range of about 100 to about 500 kcps, preferably about 300 to about 400 kcps, at a shear rate of 9.6 $sec^{-1}$ as determined on a Brookfield viscometer HBT, spindle 14, measured at 25° C.

The circuit substrates according to the present invention are preferably produced by applying a conductive paste of the present invention to a substrate, usually by the process of screen printing, to a desired wet thickness, e.g., from about 60 to about 80 microns. Automatic screen printing techniques can be employed using a 200-325 mesh screen. The printed pattern is then dried at below 200° C., e.g., preferably at about 120° C. for about 5-15 minutes before firing. The glass is fused and the metal is sintered in a controlled, non-oxidizing atmosphere belt conveyor furnace. The firing is generally done according to a temperature profile that will allow burn-out of the organic matter at about 300° C. to about 550° C., a period of peak temperature of about 650° C. to about 850° C., lasting about 5-15 minutes, followed by a controlled cool-down cycle to prevent over-sintering, unwanted chemical reactions at intermediate temperatures or substrate fracture, which can occur when the substrate cools too quickly. A non-oxidizing atmosphere such as nitrogen, argon or mixtures thereof is used to prevent oxidation of metal, especially copper, which tends to oxidize in air even at room temperature. For the purposes of the present invention a nitrogen atmosphere is preferred. The overall firing procedure will preferably extend over a period of about 30 minutes, with about 8 to 12 minutes to reach the firing temperature, about 5 to 10 minutes at the firing temperature, and about 8 to 12 minutes in cool down. In some instances, total cycle times as long as about 75 minutes may be used, with about 20 to 25 minutes to reach firing temperature, about 10 minutes at the firing temperature, and about 30 to 40 minutes in cool down.

An exemplary firing cycle is, assuming room temperature of 20° C., ramp up at 22.5° C./min for 28 minutes to a peak temperature of 650° C., holding at 650° C. for 12 minutes, and cooling at 15.5° C./min for 38 minutes to exit the furnace at about 60° C. Another exemplary firing cycle is ramp up at 29.6° C./min for 28 minutes to a peak temperature of 850° C., holding at 850° C. for 12 minutes, and cooling at 20.8° C./min for 38 minutes to exit the furnace at about 60° C.

The inventors herein discovered that glass systems based on $Bi_2O_3$ alone ("Bi glass") provides a system exhibiting good solderability, leach resistance and copper densification, after firing at 650° C., but bonding of the copper thick film to the substrate ranged from not optimal to none. The inventors herein also discovered that glass systems based on ZnO alone ("Zn glass") provide better adhesion but exhibit poor solderability and leach resistance. In the effort to overcome these challenges, the inventors herein have combined a Zn glass together with a Bi glass in a thick film copper system to provide both good substrate adhesion as well as leach resistance and solderability. Copper oxide ($Cu_2O$) also may be incorporated, either separately from the glasses, or as part of one of the glass frits, to promote even better adhesion. It is believed that copper oxide dissolves into the glass and interacts with the alumina substrate thereby forming copper aluminate to provide good adhesion to the alumina substrate. The inventors believe that the Zn glass in the glass component can bond to Mg-containing glass coatings on stainless steel substrates, either through partial melting of, and intermingling with the paste glass component, and solidification of top layers of the substrate glass coating or through interdiffusion of $Zn^{2+}$ and $Mg^{2+}$ ions in the glass coatings, or both mechanisms. Other oxides may be introduced to the inventive thick film pastes, separate from a glass composition, including any oxide disclosed herein, for example, $Bi_2O_3$, MgO, $TiO_2$, $ZrO_2$, $Li_2O$, $Na_2O$, $K_2O$, BaO, SrO, CaO, $Nb_2O_5$, and NiO.

Higher expansion glasses based on BaO and SrO, or BaO and CaO, may be used along side Bi and Zn glasses to afford fired thick film compositions having coefficients of thermal expansion (CTEs) that are sufficiently compatible with stainless steel substrates. Similarly these alkaline earth glasses are believed to provide refire stability due to their higher firing temperature characteristics. It is believed that glasses containing both Bi and Zn, because they easily incorporate high amounts of alkaline earth cations including Ba, Sr, and Ca, exhibit the desired properties as discussed hereinabove: good adhesion to substrate, good metal densification, and a wide processing window.

The following examples are intended only to illustrate the invention and should not be construed as imposing limitations upon the claims. The following experimental methods, conditions and instruments were employed in preparing the exemplary glasses detailed hereinbelow.

Green Pastes: Copper thick film pastes were made by mixing copper powders, additive oxides, and glass powders with an organic vehicle, first in a planetary mixer for homogenization, and next in a three-roll mill to achieve a fineness of grind of less than 14 μm. The viscosity of the green pastes was measured with a Brookfield HBT viscometer, 10 rpm at 25° C. using spindle 14. Shelf life of the green pastes is good.

Glasses: Various combinations of the Pb free and Cd free glasses of Table 1 were used in copper thick film paste formulations, as shown in Table 2.

Copper powder: The metal component comprises copper metal. Copper metal typically is provided in the form of at least one powder and/or flakes. Copper powders may have particle sizes ranging from about 0.1 micron to about 30 microns. In particular, more than one size range of copper particles may be used. For example, a first, finer, copper powder may have a size distribution of d10=0.1-0.3 microns, d50=0.6-1.1 microns and d90=1.5-3.5 microns. A second, coarser, copper powder may have a size distribution range of d10=2-5 microns; d50=3-8 microns; and d90=15-25 microns. All named copper powders, oxides and organic vehicles in the examples are commercially available from Ferro Corporation, Cleveland, Ohio, USA.

TABLE 1

Exemplary glass compositions for copper thick film pastes

|  | 1 Mole % | 2 Mole % | 3 Mole % |
|---|---|---|---|
| $SiO_2$ | 22.5 | 21.0 | 43.9 |
| $B_2O_3$ | 33.8 | 20.9 | 10.0 |
| Al2O3 |  | 1.9 |  |
| $Bi_2O_3$ |  |  | 21.6 |
| $ZrO_2$ |  | 2.6 |  |
| ZnO |  | 26.1 | 9.7 |
| $TiO_2$ | 10.0 | 3.2 |  |
| BaO | 33.8 |  |  |
| CaO |  |  |  |
| MgO |  |  |  |
| $Li_2O$ |  |  | 10.5 |
| $Na_2O$ |  | 10.4 | 2.5 |
| $K_2O$ |  | 0.8 |  |
| $Nb_2O_5$ |  |  | 1.9 |
| F* |  | 13.1 |  |

*batched in

TABLE 2

Paste compositions ingredients, copper, glass, binder, etc

| | Pastes | | |
|---|---|---|---|
| | A | B | C |
| Ingredients | | | |
| Cu-015 copper powder | 23.3 | 24.2 | 24.5 |
| Cu-030 copper powder | 19.8 | 19.8 | 20.9 |
| Cu-10K copper powder | 30.7 | 30.7 | 34.6 |
| $Bi_2O_3$ | 2.9 | 2.9 | 0.0 |
| $Cu_2O$ | 4.9 | 4.9 | 0.0 |
| Glass 1 | 1.9 | 2.4 | 2.0 |
| Glass 2 | 2.9 | 2.9 | 3.0 |
| Glass 3 | 1.5 | 0.0 | 1.5 |
| R2752 vehicle | 5.8 | 5.8 | 8.0 |
| 308-5V vehicle | 5.8 | 5.8 | 6.0 |
| Properties | | | |
| Resistivity, mOhm/square @ 25.4 μm | 0.5 | 0.46 | 0.48 |
| Adhesion (initial), lb | 6.3 | 4.0 | 3.04 |
| Adhesion (aged, 48 hr, 150° C.) | 5.5 | 2.88 | 1.50 |
| Solder wetting, % | >95 | >95 | >95 |
| Solder leach resistance | excellent | excellent | excellent |

TABLE 3

Properties of Exemplary Glasses 1-3

| | Glass | | |
|---|---|---|---|
| Property | 1 | 2 | 3 |
| CTE ($\times 10^{-7}$) | 89 | 87 | 92 |
| Tg (° C.) | 603 | 413 | 415 |

Substrates: The substrates used were: (1) 400 series stainless steel glazed with Ca—Mg silicate glass; and (2) 96% alumina.

Screen printing: Pastes were screen printed on the substrates using 200-325 mesh screens and a pattern appropriate for testing. The thickness of the green screen-printed paste was about 60-80 μm and upon firing decreased to 25-40 μm.

Firing profile and conditions: A belt furnace was used, with a belt speed of 1.88 inches (4.78 cm) per minute. The sample was heated to peak temperature over the course of 28 minutes. The sample was held at the peak temperature for 12 minutes. The sample was cooled at a controlled rate to about 60° C., this cooling requiring about 38 minutes. Samples were fired in a nitrogen atmosphere having less than 10 ppm $O_2$. Peak temperature was 650° C., or 850° C., or other values in between.

Testing performed included electrical characteristics, initial adhesion to substrate, aged adhesion to substrate, solder wetting, solder leach resistance, wire bonding, blistering and cosmetics. Electrical testing included determination of resistivity, expressed in mOhm/square, calculated from the measured resistance of a serpentine pattern that is 0.020 inches (50.8 μm) wide having 200 squares and a fired thickness of about 30 μm, then normalized to 25.4 μm.

Adhesion was measured by dip soldering, in which a 22 AWG Cu—Sn wire was soldered to a 0.080" by 0.080" square pad using 62Sn/36Pb/2Ag solder and KESTER®.RMA solder flux 197. KESTER® is the registered trademark of Kester Solder, Des Plaines, Ill. 60018-2675. The wires were then pulled at 90° to failure using the Shepard Crook method. Adhesion strength was expressed as pounds of force needed to break the wire. Aged adhesion was measured after subjecting the soldered joint to a temperature of 150° C. for 48 hours.

Solder wetting was measured by visual inspection of percent coverage of a 0.080"×0.080" square pad after soldering with 62Sn/36Pb/2Ag solder using RMA flux 197. Solder leach resistance was measured by visual inspection of area percent loss of an 0.020" thick print copper line after 10 second dips repeated three times in 62Sn/36Pb/2Ag solder using RMA flux 197. Wire bonding was tested using an Orthodyne 20 wirebonder with 0.010" aluminum wire. Wire pulls were recorded with a Dage 22 pull tester.

Blister test: A 0.3"×0.3" square pattern was used to test for blistering. A total of three print-dry-fire layers, printed through a 200 mesh were applied, giving a total fired thickness in excess of 70 μm. Samples were visually inspected under an optical microscope for blisters. Cosmetics: Visual observation under an optical microscope for surface roughness, line resolution, waviness and shrinkage of a printed line.

EXAMPLE 1

The inventive thick film paste, paste A in Table 2, contains in weight % the following copper powders, Cu-015 (23.3%), Cu-030 (19.8%), Cu-10K (30.7%), plus $Bi_2O_3$ (2.9%), $Cu_2O$ (4.9%), inventive glass 1 (1.9%), inventive glass 2 (2.9%), and inventive glass 3 (1.5%), as well as 5.8% each of two organic vehicles, R2752 and 308-5V. The paste composition was fired in a $N_2$ atmosphere on a glass coated 400 series stainless steel at 650° C. Selected properties of the glass compositions used in the pastes are found in Table 3. Selected properties of the paste, after firing on glass coated stainless steel, are in Table 4. A smooth surface of an adhesion pad after firing was observed, demonstrating good leveling properties. A scanning electron microscope (SEM) cross section of the aforementioned copper thick film paste, revealed excellent glass wetting and spreading on copper grains, crystals and the glassy phase without any delamination or cracking at the glass/thick film copper interface. Table 4 below shows that the adhesion of the inventive thick film copper paste on glass coated stainless steel substrate is very good. Good wetting of the fired inventive thick film was observed in connection with 62Sn/36Pb/2Ag solder.

EXAMPLE 2

The inventive thick film paste of Example 1 was fired in an $N_2$ atmosphere on a 96% alumina substrate at 650° C. Selected properties of the first paste after firing are listed in Table 4. An SEM cross section of the copper-alumina interface revealed that a thin (~1 μm) interfacial glass layer forms in between copper and the substrate. It appears that the interfacial glass, derived from the paste, wets and spreads well on both Cu grains and $Al_2O_3$ grains without cracking. Energy dispersive x-ray (EDAX) analysis shows a slight dissolution of the substrate alumina into the glass at the glass/alumina interface, which may lead to superior chemical bonding with the substrate. No intrusion of solder into the copper was observed, showing good copper densification, after firing. No blistering after three print/dry/fire cycles was observed. Very minimal leaching after dipping a soldered copper track three times in hot solder was experienced. These factors may explain the good adhesion of the thick print copper on the alumina substrate observed after firing at only 650° C.

EXAMPLE 3

The inventive thick film paste of Example 1 was fired in an $N_2$ atmosphere on a 96% alumina substrate at 850° C. Selected properties of the paste after firing are listed in Table 4. A slight drop in adhesion after 850° C. firing as compared to 650° C. may be due to a thicker interfacial glass layer (6 μm versus 1 μm) that was observed. As in 650° C. firing, an interfacial glass layer forms in between copper and alumina after 850° C. firing. Again, the glass shows excellent wetting and spreading over both copper and alumina grains without any delamination or cracking. It is believed that the dissolution of $Al_2O_3$ into the glass at the glass/alumina interface will saturate the interfacial layer with $Al_2O_3$, and the viscosity of this layer is increased to the extent that further dissolution of $Al_2O_3$ is reduced until excess $Al_2O_3$ diffuses into the interfacial layer away from the interface. The glasses of the thick print system are designed to limit the formation of a thick interfacial glass layer that may degrade adhesion when fired at high temperatures, e.g., 850° C. Good wetting of the copper by the 62Sn/36Pb/2Ag solder was experienced. The copper layer appears very dense.

EXAMPLE 4

The inventive thick film paste of Example 1 was used for the aluminum wire bonding application. Table 4 shows the properties after firing at 850° C. on a 96% alumina substrate. This copper also has good solder wetting properties. The 0.010" aluminum wires was investigated and found to be due to breakage of the wire but not at the thick film copper/$Al_2O_3$ interface affirming the good adhesion between thick print copper and alumina substrate. The paste also exhibits good adhesion when soldered with 22 AWG tin-plated copper wire. The failure manifests by the solder leaving a large area of thick print copper on the alumina substrate. Table 4, specifically columns 2 and 4 reveal that a copper paste can be fired on alumina substrate at the extremes of 650° C. or 850° C., and in either case afford very good mechanical and electrical properties.

TABLE 4

Properties of fired copper pastes

| | Firing Run # | | | |
|---|---|---|---|---|
| | 1 | 2 | 3 | 4 |
| Paste | A | A | A | A |
| Firing Temp, °C. | 650 | 650 | 850 | 850 |
| Substrate | Glass coated 400 series stainless steel | 96% Al$_2$O$_3$ | 96% Al$_2$O$_3$ | 96% Al$_2$O$_3$ |
| Property | | | | |
| Viscosity (kcps) | 300-400 | 300-400 | 300-400 | 300-400 |
| Solid Content (wt %) | 86-88 | 86-88 | 86-88 | 86-88 |
| Resistivity, mOhm/square @ 25.4 μm fired thickness | 0.5 | 0.5 | 0.6 | 0.4 |
| Adhesion (initial), lb | 6.3 | 6.8 | 5.8 | 7.5 |
| Adhesion (Aged, 48 hour 150° C.), lb | 5.5 | 5.5 | 5.3 | 6.3 |
| Solder wetting, % | >95 | >95 | >90 | >95 |
| Solder leach resistance | excellent | excellent | excellent | excellent |
| Wire bond strength 0.010" Al wire initial | n/a | n/a | n/a | 600 g |
| Wire bond strength 0.010" Al wire, aged, 300° C., 1 hour | n/a | n/a | n/a | 420 g |

It will be appreciated that although in the previous Examples the substrates employed were limited to glass coated stainless steel and alumina, the thick film pastes of the present invention may be utilized in conjunction with a variety of substrates, including but not limited to porcelain enamel coated steel, beryllia substrates, glass substrates, barium titanate substrates, aluminum nitride substrates and silicon carbide substrates. Additionally, it will be appreciated that in addition to the screen printing technique utilized in the previous Examples, the thick film pastes of the present invention may be applied using a variety of additional techniques known in the art including spraying, brushing, dipping, ink-jet or doctor blade.

It will also be appreciated that the term "glass" as used herein is intended to be afforded a broad interpretation and thus it encompasses both glasses, and glass-ceramics that display some degree of crystallization.

Additional advantages and modifications will readily occur to those skilled in the art. Therefore, the invention in its broader aspects is not limited to the specific details and illustrative examples shown and described herein. Accordingly, various modifications may be made without departing from the spirit or scope of the general inventive concept as defined by the appended claims and their equivalents.

What is claimed is:

1. A conductive thick film paste comprising a solids portion comprising a glass component and a metal component, said glass component comprising:
   a. a first glass composition comprising in mole %,
      i. about 5 to about 35% ZnO,
      ii. about 5 to about 40% SiO$_2$, and
      iii. about 2 to about 35% B$_2$O$_3$,
   b. a second glass composition comprising in mole %,
      i. about 20 to about 70% Bi$_2$O$_3$,
      ii. about 20 to about 50% SiO$_2$, and
      iii. about 2 to about 30% B$_2$O$_3$,
   c. a third glass composition comprising in mole %, about 5 to about 80% Bi$_2$O$_3$,
   d. no lead or lead oxide, and
   e. no cadmium or cadmium oxide.

2. The thick film paste of claim 1, wherein the first glass composition further comprises about 0.1 to about 25 mol % CuO.

3. The thick film paste of claim 1, wherein the first glass composition further comprises about 0.1 to about 10 mol % NiO.

4. The thick film paste of claim 1, wherein the ZnO content of the second glass composition is about 10 to about 30 mol %.

5. The thick film paste of claim 2, wherein the ZnO content of the second glass composition is about 10 to about 30 mol %.

6. The thick film paste of claim 3, wherein the ZnO content of The second glass composition is about 10 to about 30 mol %.

7. The thick film paste of claim 3, wherein the first glass composition comprises about 15 to about 65 mol % Bi$_2$O$_3$.

8. The thick film paste of claim 3, wherein the first glass composition comprises about 15 to about 50 mol % Bi$_2$O$_3$.

9. The thick film paste of claim 1, wherein the metal component comprises copper.

10. The thick film paste of claim 9, wherein the copper is in the form of first and second powders having a bimodal size distribution, said first powder having a size distribution described by d10=0.1-0.3 microns, d50=0.6-1.1 microns and d90=1.5-3.5 microns, and said second powder having a size distribution described by d10=2-5 microns; d50=3-8 microns; and d90=15-25 microns.

11. A method of making an electronic device comprising:
   a. providing a substrate and conductive thick film paste comprising a solids portion, wherein the paste comprises a glass component and a metal component, wherein the glass component comprises:
      i. a first glass composition comprising in mole %:
         1. about 5 to about 35% ZnO,
         2. about 5 to about 40% SiO$_2$, and
         3. about 2 to about 35% B$_2$O$_3$, ii. a second glass composition comprising in mole %:
   1. about 20 to about 70% $Bi_2O_3$,
   2. about 20 to about 50 % $SiO_2$, and
   3. about 2 to about 30% $B_2O_3$,
iii. a third glass composition comprising in mole %, about 5 to about 80% $Bi_2O_3$,
iv. no lead or lead oxide, and
v. no cadmium or cadmium oxide,
b. applying said paste upon said substrate;
c. firing the paste and substrate at a temperature of from about 650° to about 850° C.

12. The method of claim 11, wherein the metal component comprises copper.

13. The method of claim 12, wherein the copper is in the form of a powder having a particle size of about 0.1 micron to about 30 microns.

14. The method of claim 12, wherein the copper is in the form of first and second powders having a bimodal size distribution, said first powder having a size distribution described by d10=0.1-0.3 microns, d50=0.6-1.1 microns and d90=1.5 -3.5 microns, and said second powder having a size distribution described by d10=2-5 microns; d50=3-8 microns; and d90=15-25 microns.

15. The method of claim 11, wherein said substrate is selected from the group consisting of an alumina substrate, a porcelain enamel coated steel substrate, a beryllia substrate, a barium titanate substrate, an aluminum nitride substrate and a silicon carbide substrate.

* * * * *